US010435030B2

(12) United States Patent
Vaucher et al.

(10) Patent No.: US 10,435,030 B2
(45) Date of Patent: Oct. 8, 2019

(54) FUNCTION MONITOR

(71) Applicant: NXP B.V., Eindhoven (NL)

(72) Inventors: Cicero Silveira Vaucher, Eindhoven (NL); Luc van Dijk, Nijmegen (NL)

(73) Assignee: NXP B.V., Eindhoven (NL)

( * ) Notice: Subject to any disclaimer, the term of this patent is extended or adjusted under 35 U.S.C. 154(b) by 982 days.

(21) Appl. No.: 14/508,687

(22) Filed: Oct. 7, 2014

(65) Prior Publication Data

US 2015/0142386 A1 May 21, 2015

(30) Foreign Application Priority Data

Nov. 20, 2013 (EP) ..................................... 13193720

(51) Int. Cl.
| | |
|---|---|
| *B60W 50/04* | (2006.01) |
| *G01R 31/00* | (2006.01) |
| *B60W 50/02* | (2012.01) |
| *B60W 50/00* | (2006.01) |
| *B60W 50/029* | (2012.01) |

(52) U.S. Cl.
CPC ........ *B60W 50/04* (2013.01); *B60W 50/0225* (2013.01); *G01R 31/005* (2013.01); *B60W 2050/0016* (2013.01); *B60W 2050/0215* (2013.01); *B60W 2050/0295* (2013.01)

(58) Field of Classification Search
CPC ...... H02M 3/127; H03F 1/52; G01R 31/3191; G01R 31/005; G06F 17/00; B60W 31/00; B60W 30/16; B60W 50/04; B60W 50/0225; B60W 2050/0016; B60W 2050/0215; B60W 2050/0295; B60T 17/228; G07C 5/0808; G01M 17/007; G11C 29/02

USPC ............... 323/284; 324/532; 330/251; 701/1
See application file for complete search history.

(56) References Cited

U.S. PATENT DOCUMENTS

| 4,361,870 A * | 11/1982 | D'Agostini .......... G07C 5/0808 |
| | | 701/29.6 |
| 5,249,125 A * | 9/1993 | Root ..................... B60T 17/228 |
| | | 246/182 B |

(Continued)

FOREIGN PATENT DOCUMENTS

| CN | 2589273 Y | 12/2003 |
| CN | 101059698 A | 10/2007 |

(Continued)

OTHER PUBLICATIONS

Wagner, C. et al. "A 77GHz Automotive Radar Receiver in a Wafer Level Packag", IEEE Radio Frequency Integrated Circuits Symp., pp. 511-514 (2012).

(Continued)

*Primary Examiner* — Regis J Betsch
*Assistant Examiner* — Kaleria Knox
(74) *Attorney, Agent, or Firm* — Rajeev Madnawat

(57) ABSTRACT

A function monitor for a system, such as an advanced driver assistance system, comprising a first function monitor element and a second function monitor element, said first function monitor element configured to receive and collate sensor data from a plurality of sensors associated with the system and send a function warning signal to said second function monitor element when said sensor data from one or more of the plurality of sensors is indicative of a functional irregularity.

20 Claims, 3 Drawing Sheets

(56) References Cited

U.S. PATENT DOCUMENTS

| | | | |
|---|---|---|---|
| 7,019,506 B2* | 3/2006 | Kernahan | H02M 3/157 323/284 |
| 2006/0221690 A1* | 10/2006 | Rehm | G11C 29/02 365/185.09 |
| 2008/0167772 A1 | 7/2008 | Du et al. | |
| 2009/0051427 A1* | 2/2009 | Miyashita | H03F 1/52 330/251 |
| 2009/0164059 A1 | 6/2009 | Takeda | |
| 2011/0082624 A1* | 4/2011 | Yamamoto | F02D 29/02 701/41 |
| 2013/0238166 A1* | 9/2013 | Breu | G01M 17/007 701/2 |
| 2013/0304276 A1* | 11/2013 | Flies | G06F 17/00 701/1 |

FOREIGN PATENT DOCUMENTS

| | | |
|---|---|---|
| CN | 101127130 A | 2/2008 |
| CN | 101217474 A | 7/2008 |
| CN | 101840632 A | 9/2010 |
| CN | 101853020 A | 10/2010 |
| CN | 102509419 A | 6/2012 |
| CN | 102540998 A | 7/2012 |
| CN | 103124086 A | 5/2013 |
| DE | 10 2004 058 359 A | 7/2005 |
| EP | 1 726 501 A1 | 11/2006 |
| EP | 1726501 A1 * | 11/2006 ............ B60K 31/00 |
| EP | 2 072 366 A1 | 6/2009 |

OTHER PUBLICATIONS

Knapp, H. et al. "Three-Channel 77 GHz Automotive Radar Transmitter in Plastic Package", IEEE Radio Frequency Integrated Circuits Symp., pp. 119-122 (2012).

Extended European Search Report for EP Patent Appln. No. 13193720.3 (dated Apr. 1, 2014).

Chinese Office Action for Patent Appln. No. CN201410659114.7 (dated Nov. 16, 2016).

* cited by examiner

Fig. 5
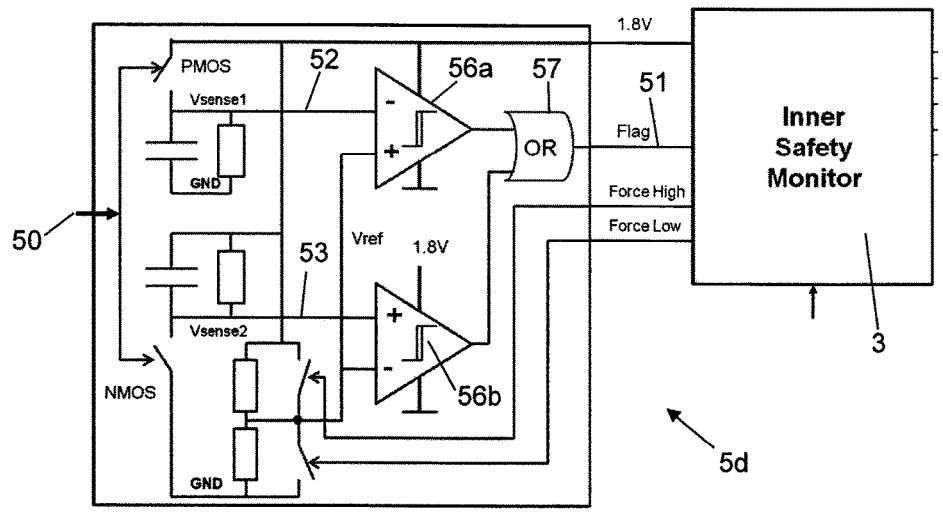
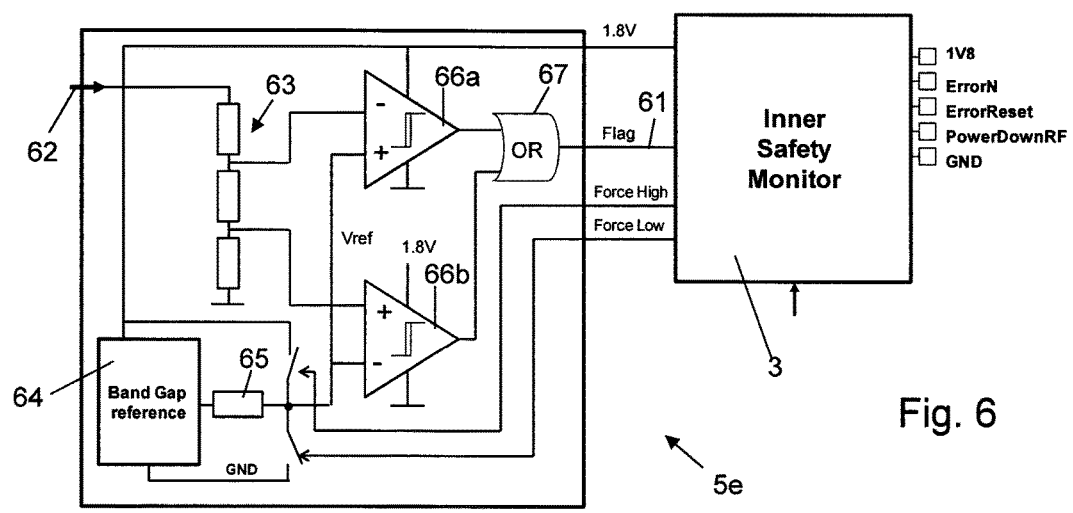
Fig. 6

FUNCTION MONITOR

CROSS-REFERENCE TO RELATED APPLICATIONS

This application claims the priority under 35 U.S.C. § 119 of European patent application no. 13193720.3, filed on Nov. 20, 2013, the contents of which are incorporated by reference herein.

This invention relates to a function monitor for monitoring the function of a system. The system may comprise a safety critical system and may comprise an advanced driver assistance system. It also relates to an advanced driver assistance system including the function monitor. Further, the invention relates to an electronic module for providing function monitoring.

Systems that provide certain services, such as safety critical services, may be monitored by a function monitor. The function monitor is used to check that component parts or processes with the system are operating within predetermined limits. Ensuring that the component parts/processes are functioning correctly can make the overall system more reliable. If an irregularity is detected with a component part or process of the system, action can be taken to ensure that the service provided by the system is not affected detrimentally.

A function monitor may be used in advanced driver assistance systems, such as an Automatic Emergency Braking (AEB) system. An AEB system provides the service of detecting whether a vehicle is likely to collide with another object and can apply the brakes to avoid or reduce the damage incurred in the collision. An AEB system typically uses a radar assembly comprising an RF transmitter and receiver to measure the distance between the vehicle and an object and uses the closing speed between the vehicle and object to determine if the brakes should be automatically actuated. The correct operation of such a system is important given that the system can intervene in the control of the vehicle. The function monitor can therefore ensure that component parts (such as transmitters, receivers, oscillators, electronic components) are operating correctly, as well as processes (such as calculations and signal processing processes) are generating appropriate values on which the service provided by the system makes decisions. The functional safety of such systems forms part of established standards, such as ISO 26262.

According to a first aspect of the invention we provide a function monitor for a system, such as an advanced driver assistance system, comprising a first function monitor element and a second function monitor element, said first function monitor element configured to receive and collate sensor data from a plurality of sensors associated with the system and send a function warning signal to said second function monitor element when said sensor data from one or more of the plurality of sensors is indicative of a functional irregularity.

Thus the function monitor monitors component parts or processes within the system that enable the system to provide a service, such as Automatic Emergency Braking, to a user. This is advantageous as the first function monitor element can act as a central reporting element for the sensors and inform the second function monitor element when a function irregularity is detected. The second function monitor element can therefore manage the function irregularities rather than having to detect and read information from the sensors.

The second function monitor element may comprise a digital signal processor (DSP) or microcontroller. The DSP or microcontroller may be configured to process data for providing a service of the system. Alternatively or additionally, the digital signal processor or microcontroller may be configured to perform signal processing on processes involved in providing the service of the system for the purpose of detecting function irregularities. For example, the microcontroller or DSP may be configured to determine irregularities in baseband signal amplitude, baseband signal phase, baseband noise level, ADC clipping, digital signal circuitry, transmit signal amplitude and/or phase noise level in data received from a radar assembly of the system.

Thus, the microcontroller or digital signal processor may be configured to process radar signals in addition to managing function irregularities received from the first function monitor element. The system may comprise an autonomous emergency braking system.

The function warning signal may comprise an interrupt. Thus, the second function monitor element may be configured, on receipt of the interrupt, to execute an irregularity handling procedure.

The first function monitor element may be dedicated to monitoring for functional irregularities in the system and the second function monitor element may be configured to additionally process data for providing a service of the system. For example, an advanced driver assistance system.

The first function monitor element may store identifying details of function irregularities in a memory and/or identifying details of the part of the system that generated the function irregularity. The memory may comprise a register, such as a serial peripheral interface read register.

The plurality of sensors may comprise at least one or more of;
 i) a temperature sensor;
 ii) a RF connection break sensor;
 iii) an oscillator fault detector sensor;
 iv) clock fault sensor;
 v) voltage level sensor.

The connection break sensor may comprise a ball break sensor for detecting connection problems associated with solder balls breaking from electronic circuitry. The oscillator fault detector sensor may be configured to detect an out-of-lock condition of a phase locked loop.

The first function monitor element may comprises a state machine. Thus, the first function monitor element may be configured to receive a logical signal from each of the sensors and comprise an internal flag that is operated in response to one or more of the logical signals received from the sensors. The flag may be used to signal to the first function monitor element that an irregularity has been detected.

Each sensor may include an irregularity detecting arrangement including a trigger having an irregularity detected state and a no irregularity detected state, the trigger configured to adopt the irregularity detected state when the arrangement detects that a measurement value is outside of a predetermined threshold. Thus, each sensor includes means to determine if the parameter it is measuring is outside of a desired range or above or below a desired threshold. At least one or all of the sensors may be configured to receive a trigger test signal configured to provide a condition to cause the trigger of the irregularity detecting arrangement (if it is working correctly) to generate a test signal as if it had detected an irregularity for self-testing of the sensors.

The sensor data received from the sensors may comprise a signal that indicates the state of the irregularity detecting arrangement.

In response to receiving a function warning signal, the second function monitor element may be configured to selectively provide a reset signal to said first function monitor element and, in response to receiving the reset signal, the first function monitor element is configured to reset the sensor that caused it to generate the function warning signal. The monitor may be configured such that the reset signal is used as the test signal.

In which in response to receiving a function warning signal, the second function monitor element may be configured to selectively provide a power down signal to said first function monitor element and, in response to receiving the power down signal, the first function monitor element is configured to provide instructions to power down the system.

Communication between the first function monitor element and second function monitor element may be provided by three hardware lines comprising;
 a function irregularity reporting line for providing the function warning signal to the second function monitor element,
 a reset sensor line for providing a reset signal to the first function monitor element for resetting a detected function irregularity; and
 a power down line for providing a power down signal to the first function monitor element to deactivate the system.

The function warning signal may comprise a logical signal indicating the absence or presence of a detected irregularity. The first function monitor element may, on receipt of the reset signal, provide a reset signal to at least one of the sensors.

The first function monitor may receive a separate power supply to the second function monitor. Thus, the first function monitor element is not powered by the second function monitor element or vice versa. Instead, the first and second function monitor element may receive a power supply from the PCB on which the components may be mounted.

The second function monitor element may be configured to selectively send an irregularity enquiry request to said first function monitor element and, in response to said request, the first function monitor element is configured to report the status of one or more of the sensors. The irregularity enquiry request may be sent by a Serial Peripheral Interface (SPI) and the status may be reported from an SPI read register of the first function monitor element.

The function monitor may be configured to monitor a plurality of parameters associated with the system for detecting function irregularities in the operation of the system, a first subset of the parameters configured to be monitored by the first function monitor element and a different, second subset of the parameters configured to be monitored by the second function monitor element, wherein the first subset comprises at least one parameter configured to be compared with a threshold value and the second subset comprises at least one parameter requiring signal processing, such as Fourier analysis, to determine if it is indicative of a function irregularity.

According to a second aspect of the invention we provide an advanced driver assistance system including the function monitor of the first aspect of the invention.

According to a third aspect of the invention we provide an integrated circuit (IC) assembly including the function monitor as defined in the first aspect. The assembly may include a front-end IC including the first function monitor element and a, possibly separate, microcontroller hosting the second function monitor element.

There now follows, by way of example only, a detailed description of embodiments of the invention with reference to the following figures, in which:

FIG. 5 shows an example clock monitor sensor; and

FIG. 6 shows an example voltage supply sensor.

Figure 1:
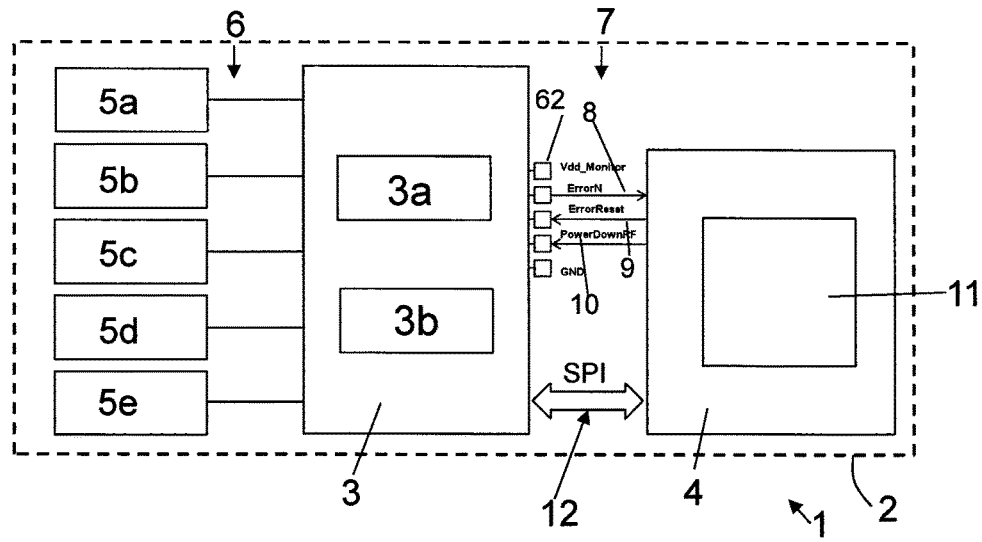
FIG. 1 shows an example embodiment of the function monitor and system.

FIG. 1 shows an example embodiment of a function monitor 1 within an advanced driver assistance system 2. In particular, in this example, the advanced driver assistance system (ADAS) comprises an autonomous emergency braking (AEB) system. The AEB system may utilise a radar assembly comprising a RF transmitter and receiver to measure distances and other parameters between the vehicle in which the system is mounted and other objects. Other advanced driver assistance systems, which are systems that provide assistance to a driver of a vehicle using data about the vehicle and/or the vehicle's surroundings, include radar guided cruise control, lane departure warning system, automatic parking and an automated driving system. It will be appreciated that the invention has other applications in function monitoring, in vehicle related systems and non-vehicle related systems. The function monitor comprises a safety device that monitors the function of system components to ensure that the system operates safely and reliably. Thus, the function monitor is configured to detect irregularities, such as faults, with components and processes as well as conditions, such as extreme temperatures, that may affect the function of the components.

The function monitor comprises a first function monitor element 3 and a second function monitor element 4. The first function monitor element 3 is configured to receive and collate sensor data from a plurality of sensors 5a-e associated with the advanced driver assistance system 1 and send a function warning signal to said second function monitor element 4 when the sensor data from one or more of the plurality of sensors 5a-e is indicative of a functional irregularity. This is advantageous as the function monitor 1 is distributed over the system 2 in two parts, which may lead to more reliable performance of the function monitor and the advanced driver assistance system as a whole.

The first function monitor element 3 comprises a dedicated device configured to receive and collate functional irregularities associated with each of the sensors 5a-e for reporting to the second function monitor element. Identifying details of function irregularities may also be stored in the first function monitor element 3 for reporting to the second function monitor element 4. A flag 3a may be used to store the fact that an irregularity has been detected by one or more of the sensors 5a-e and a function irregularity register 3b may used to store the identifying details of the sensor that reported the irregularity. The flag may be provided by a flip-flop to store the receipt of a function irregularity from the sensors. A separate flip flop may be provided for each of the sensors. Alternatively, a single flip flop may act as a flag for irregularities received from any one or more of the sensors and therefore indicate when an irregularity has occurred. The function irregularity register comprises a memory that may comprise a Serial Peripheral Interface read register, for storing details of the irregularities generated by the sensors. In particular, the register typically stores which of the sensors 5*a-e* has generated a functional irregularity.

The first function monitor element 3 provides a connection point for all of the sensors 5*a-e*. The first function monitor element 3 includes an interface 6 for each of the sensors 5*a-e* comprising a power supply line 20 for supplying the sensor with power from the element 3, a functionality line 21 for receiving a signal representative of functional irregularities in the system 1 and a reset line 22 for resetting the sensor.

The first function monitor element 3 also includes an interface 7 with the second function monitor element 4. This interface may comprise three digital lines; a function irregularity reporting line 8, a reset line 9 and a system power down line 10. The function irregularity reporting line 8 provides communication from the first function monitor element 3 to the second function monitor element 4, and may be a one-way communication line, for informing the second function monitor element 4 of function irregularities. The reset line 9 allows the first function monitor element 3 to receive instructions from the second function monitor element 4 to reset a functional irregularity condition flag 3*a*. The system power down line 10 provides for communication from the second function monitor element 4 to the first function monitor element 3 for causing the powering down of the AEB system 1, and, in particular, the RF transmitter and receiver components of the AEB system. The first function monitor element 3 may comprise a "front-end" integrated circuit separate from the second function monitor element 4, which may comprise a microcontroller. The first function monitor element 3 may receive a separate power supply 23 to the second function monitor element 4 and a separate ground connection 24. The element 3 may also have an input connected to a power supply line 62 to be functionally monitored.

The second function monitor element 4 comprises a microcontroller 11 or, in other embodiments, a digital signal processor. The microcontroller 4 may not be dedicated to function monitoring and may perform functions associated with operation of the AEB system 1 and, in addition, handle function monitoring through its interface 7 with the first function monitor element 3. The microcontroller 4 may therefore execute instructions to provide automatic emergency braking using information collected from a RF transmitter and receiver. The sensors 5*a-e* may be associated with the RF transmitter and receiver to monitor their function and/or environmental conditions. In addition to the interface 7 between the first and second function monitor elements 3, 4, a data collection interface 12 may be provided for exchange of more detailed information regarding the functional irregularities registered by the first function monitor element 3, such as which sensor 5*a-e* has generated a functional irregularity signal. The interface 12 may be provided by a Serial Peripheral Interface (SPI) Bus. Operation of such a controller will only be briefly described herein. The second function element comprises a Master SPI controller, which connects to the first function monitor element 3 by a typical four signal line SPI bus: serial clock (SCL), Master-Out Slave-In (MOSI), Master-In Slave-Out (MISO), and slave select bar (SSn). Data can be written by element 4 into SPI registers in element 3 by means of the MOSI signal, and be read from SPI registers in element 3 by element 4 by means of the MISO signal. Further, the second function monitor element 4 may also monitor parameters of the system 2 to check for functional irregularities independently of the first function monitor element 3. For example, the second function monitor element 4 may be configured to assess for irregularities in system parameters such as baseband signal amplitude, baseband signal phase, baseband noise level, ADC clipping, digital signal circuitry, transmit signal amplitude, phase noise level, MMIC register programming and MMIC register configuration.

Thus, the first and second function monitor elements share the function monitoring duties, with the second function monitor element 4 managing reports of irregularities from the first function monitor element 3. The first function monitor element may comprise a state machine to receive and collate reports of irregularities from a plurality of sensors, said sensors capable of determining if the signal they are measuring is acceptable or irregular, and the second function monitor element may include a processor for managing (by at least instructing the resetting of the sensor that cause the irregularity or shutting down the system) the function irregularities reported to it by the first function monitor element as well as performing function irregularity checks independent of the first function monitor element. The second function monitor element, due having data processing capabilities, rather than a state machine, may perform functional checks that require signal processing such as Fourier Transforms. Thus, a first subset of the function irregularity checks is performed by the first function monitor element 3 and a different, second subset is performed at the second function monitor element 4, wherein the second subset comprises function irregularity checks that require signal processing. The first subset may comprise function irregularity checks that comprise a comparison of a measured value with a threshold. Thus, a layered monitoring function is provided. Further, the first subset may be performed by the sensors themselves and the first function monitor element 3 may receive and collate the function irregularity signals generated by the sensors, as will be described in more detail below.

Figure 2:
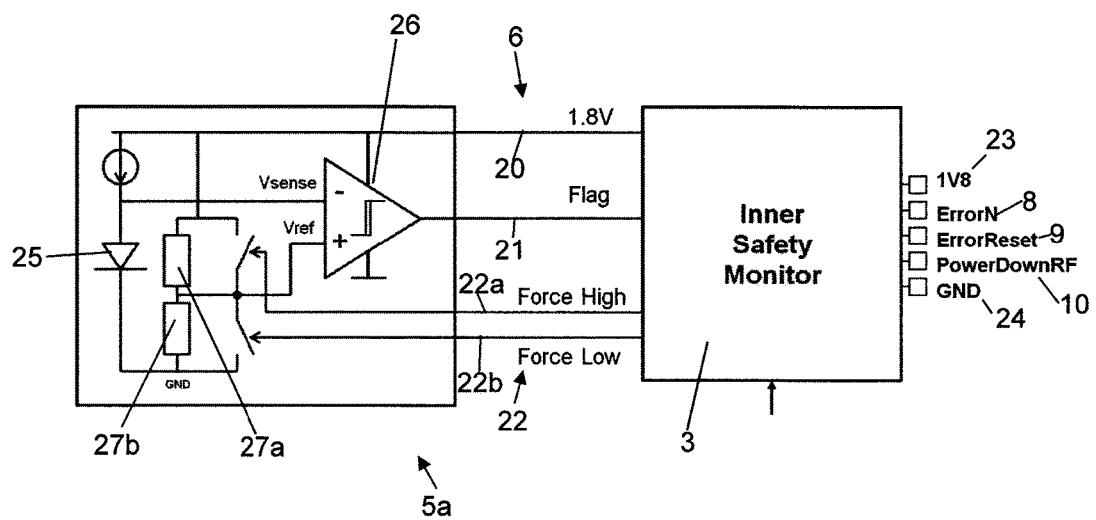
FIG. 2 shows an example temperature sensor.

FIG. 2 shows the connection between the first function monitor element 3 and one of the sensors 5*a-e*. In this embodiment, sensor 5*a* comprises a temperature sensor for monitoring the temperature of a radar transmitter associated with the AEB system 1. It will be appreciated that the transmitter will have a range of operating temperatures in which it is approved to operate reliably. Thus, monitoring the temperature of the transmitter can ensure that it is operating within its approved operating conditions. The irregularity detecting arrangement thus comprises a temperature sensor 5*a* including a temperature sensing diode 25 adapted such that the voltage across the diode falls in response to rising temperature. A Schmitt-trigger 26 is provided to generate a flag condition when the voltage across the diode 25 is below a threshold value, which may be a lower safe operating limit of the transmitter. The threshold value is determined by the relative size of resistors 27*a*, 27*b* connected between the power supply line 20 and ground wherein a node between the resistors provides an input to one of the inputs of the Schmitt-trigger 26. The other input of the Schmitt trigger is provided by a node between the diode 25 and power supply line 20. The reset line 22 comprises two lines; a force high line 22*a* and a force low line 22*b*. These lines are used to reset the Schmitt-trigger 26 and also to trigger the Schmitt-trigger for self-testing purposes.

The Schmitt-trigger 26 is connected to the functionality line 21 and thus provides a signal indicative of a functional irregularity to the element 3 until the trigger 26 is reset. The functional irregularity is that the transmitter is experiencing a temperature outside its accepted operated conditions and could potentially be generating spurious RF signals. As mentioned above, the signal on functionality line 21 is stored in a flip flop in the element 3 and logged in an SPI register. The reset line 22 comprises two lines; a force high line 22a and a force low line 22b. These lines are used to reset the Schmitt-trigger 26 and also to trigger the Schmitt-trigger for self-testing purposes. Upon reset, the Schmitt-trigger 26 stops providing the signal indicative of a functional irregularity to the element 3 on line 21. However, should the diode 25 continue to detect a temperature outside of the threshold, the trigger 26 will be triggered once again. The sensor 5a, by virtue of the Schmitt-trigger 26 and associated circuitry can determine when an irregularity occurs and report it to the element 3 with a two-state signal comprising irregularity present (signal output by Schmitt trigger) and irregularity not present (no signal output by Schmitt trigger).

Figure 3:
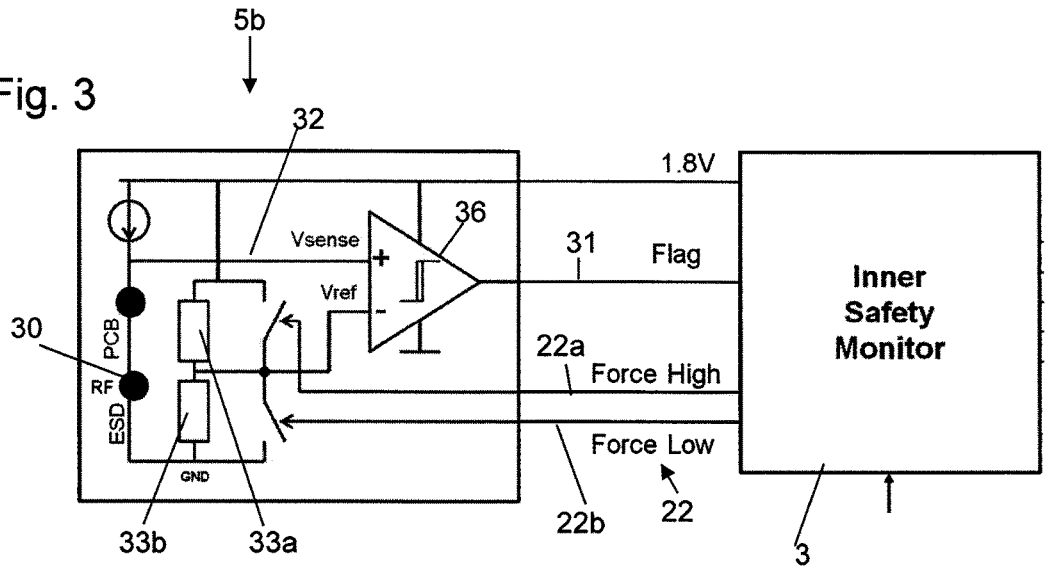
FIG. 3 shows an example RF ball break sensor.

FIG. 3 shows a further one of the sensors 5a-e and its interface with the first function monitor element 3. In this embodiment, sensor 5b comprises a connection integrity sensor for monitoring if a connection and/or solder ball 30 in the RF transmitter and/or receiver associated with the AEB system 1 is broken. The sensor includes a Schmitt-trigger 36 connected to the functionality line 31 and thus provides a signal indicative of a functional irregularity to the element 3 until the trigger is reset. The irregularity comprises a connection problem in the RF transmitter or receiver that may affect their operation. When an RF solder ball 30 breaks, the DC voltage on Vsense line 32 rises towards 1.8V, which is the voltage present on the power supply line 20. On exceeding a threshold voltage value determined by resistive dividers 33a and 33b, the Schmitt-trigger comparator 36 raises a flag in the first function monitor element 3 by way of a signal on functionality line 31.

Figure 4:
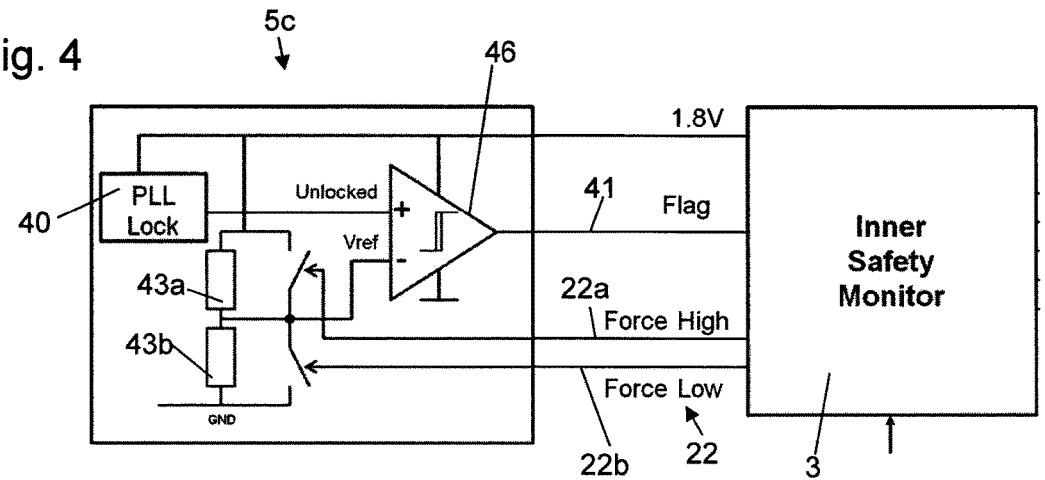
FIG. 4 shows an example phase lock loop out-of-lock sensor.

FIG. 4 shows a further one of the sensors 5a-e and its interface with the first function monitor element 3. In this embodiment, sensor 5c comprises an oscillator lock sensor for monitoring if a phase locked loop 40 of the RF transmitter and/or receiver associated with the AEB system 1 is operating correctly. The sensor includes a Schmitt-trigger 46 connected to the functionality line 41 and thus provides a signal indicative of a functional irregularity to the element 3 until the trigger is reset. The irregularity comprises an out-of lock condition in the phase-locked loop 40 chirp generator. Such an irregularity may occur by erroneous programming of chirp sweep parameters in relation to a programmed voltage controlled oscillator sub-band. Architectures suitable for detecting an out-of-lock condition will be known to those skilled in the art and therefore will not be described here. However, when a voltage indicative of an out-of-lock condition is supplied to one of the inputs of the Schmitt-trigger 36, a signal is supplied to the functionality line 41. The out-of-lock threshold value is determined by the relative size of resistors 43a, 43b connected between the power supply line 20 and ground wherein a node between the resistors provides an input to the other input of the Schmitt-trigger 26. The reset line 22 comprises two lines; a force high line 22a and a force low line 22b. These lines are used to reset the Schmitt-trigger 46 and also to trigger the Schmitt-trigger for self-testing purposes.

FIG. 5 shows a further one of the sensors 5a-e and its interface with the first function monitor element 3. In this embodiment, sensor 5d comprises a master clock monitor sensor for detecting the absence of a master clock signal 50. It is typical for AEB systems to include a 40 MHz master clock for operation. The sensor 5d includes two Schmitt-triggers 56a and 56b connected to the functionality line 51 via an OR gate 57 and thus provides a signal indicative of a functional irregularity to the element 3 if either of the Schmitt-triggers are triggered, until the triggers are reset. The irregularity comprises loss of the master clock signal.

In the event of a clock signal failure, the clock signal 50 will either stay permanently at logic high or at a logic low condition. In case the clock stays at a high logic level for more than a predefined time, a signal on "Vsense1" 52 is supplied to the first Schmitt-trigger 56a. Alternately if clock stays at logic low for more than a predetermined time a signal on "Vsense2" 53 is supplied to the second Schmitt-trigger 56b. The presence of a signal on Vsense1 or Vsense2 greater or less than a threshold value cause the associated Schmitt-trigger 56a, 56b to output a signal along functionality line 51 to the element 3 via the OR gate 57. Similarly to the other sensor embodiments, lines "Force High" 22a and "Force Low" 22b are used to reset the error condition in the Schmitt trigger and to perform self-check error injection.

FIG. 6 shows a further one of the sensors 5e and its interface with the first function monitor element 3. In this embodiment, sensor 5e comprises a supply voltage sensor for detecting disruptions to the power supplied on the power supply line 62. The power supply line 62 may be configured to supply power to a RF transmitter associated with the AEB system 1. The sensor 5e includes two Schmitt-triggers 66a and 66b connected to the functionality line 61 via an OR gate 67 and thus provides a signal indicative of a functional irregularity to the element 3 if either of the Schmitt-triggers are triggered, until the triggers are reset. The irregularity comprises disruption to the power supply.

The voltage to be monitored is applied to a resistive divider 63 with three resistor elements. A reference voltage is derived from a band gap reference cell 64, which is applied to positive and negative inputs of the Schmitt-triggers 66a, 66b. The Schmitt-trigger whose positive input is connected to the reference voltage will detect negative glitches or a too low (stable) voltage level on voltage supply line 62; the other comparator will detect positive glitches or a too high voltage level on the voltage supply line 62. By virtue of the OR gate 67, triggering of either Schmitt-trigger will apply a signal along functionality line 61. Dimensioning of the restive divider 63 follows as a function of the specified threshold levels to be detected.

Similarly to the other sensor embodiments, lines "Force High" 22a and "Force Low" 22b are used to reset the error condition in the Schmitt triggers and to perform self-check error injection on a regular basis under control of the first function monitor element 3. A protection resistor 65 connected to the output of the bandgap reference cell 64 is to protect it from short-circuit conditions when the Force High and Force Low signals are applied.

It will be appreciated that other sensors may be provided for monitoring conditions or processes of the system to be monitored. Sensors may be provided to monitor local oscillator power, phase noise level, chirp purity, transmit power condition, temperatures of the system, supply voltage conditions, RF connections and broken solder balls, properties of receiver components, such as noise level, amplitude and phase stability at different stages of the receiver circuitry, ADC clipping, mixer signals, power amplifier output levels, clock signals, function irregularity register (comprising a memory) integrity among others. The interface 5 between each sensor and the first function monitor element 3 may comprise the same arrangement of power supply, functionality line and a reset line (which may comprises two reset sub lines). Thus, each sensor module may include a trigger supplied with a signal from irregularity determining circuitry to "measure" a parameter and, upon going beyond one or more thresholds, provide a persistent signal indicative of the occurrence of an irregularity in that parameter until a reset signal is applied to the module. Each sensor module is therefore capable of detecting the presence or absence of an irregularity, which it can report to the first function monitor element 3.

In use, the AEB system 2 may be operational and the microcontroller of the second function monitor element 4 may be processing signals to and from a RF transmitter/receiver assembly for providing an automatic emergency braking service. The microcontroller may also monitor the function of various components and/or processes in the system 2, such as noise levels in the signals received from the RF transmitter/receiver that forms a radar assembly, by monitoring parameters associated with those functions.

The first function monitor element 3, which comprises a separate electronic component, possibly embodied on a separate integrated circuit, to the second function monitor element 4, also monitors the function of other components and/or processing stages using the sensors 5*a-e*. The sensors, on detection of an irregularity, provide a high level signal on their functionality line 21, 31, 41, 51, 61 to inform the first function monitor element 3. The signal received along the functionality line activates a flag in the first function monitor element 3, which may be provided by a bistable component such as a flip flop 3*a*. A function irregularity register 3*b*, such as an SPI register, stores identifying detail of the sensor that sensed an irregularity. This may be achieved by mapping each sensor into a separate and unique binary position within the SPI register to be read by microcontroller of the second function monitor element 4.

If the parameters sensed by the sensors 5*a-e* and reported to the second function monitor 4 via the first function monitor element 3, or parameters assessed directly by the second function monitor element 4 exceed predetermined thresholds, the second function monitor element 4 may ignore signals from the radar assembly and/or deactivate the system 1 and may warn the user that the system is non-operational. With this function monitor set-up, undesirable and dangerous braking actions from a vehicle which would be generated as a consequence of a functional irregularity condition within the radar sensor may be avoided.

The activation of the flip flop flag causes a logic high level signal to be provided along function irregularity reporting line 8. Thus, the presence of the signal on line 8 indicates that an irregularity has been detected at any one of the sensors 5*a-e*. The function irregularity reporting line 8 acts as an interrupt to the microcontroller which may initiate an irregularity handling procedure. Alternatively, the microcontroller may intermittently read the logical state of function irregularity reporting line 8, for example each 40 ms.

The irregularity handling procedure may comprise generating a reset signal a predetermined number of times (each in response to the receipt of a distinct function warning signal on function irregularity reporting line 8) via the reset line 9. This may be done to check if the irregularity is persistent rather than spurious or only present temporarily. On receipt of the reset signal, the first function monitor element 3 may refer to the function irregularity register to determine which of the sensors 5*a-e* triggered the error. It may then send a reset signal via reset line 22 to reset the Schmitt-trigger of that particular sensor. Alternatively, the first function monitor element 3 may send a reset signal via all of the reset lines 22 to reset all of the triggers in all of the sensors 5*a-e*.

The irregularity handling procedure may comprise, possibly after issuing a reset signal a predetermined number of times, generating a power down signal via system power down line 10. The power down signal is received by the first function monitor element 3 or a separate element within a front-end IC which hosts the element 3. The power down signals may be latched within a flip-flop and then be used in biasing cells generating biasing currents for power amplifiers and receiver functions of the AEB system.

Thus, the microcontroller receives notice that a function irregularity has occurred in any one or more of the sensors via the function irregularity reporting line 8. The microcontroller can discover details of the irregularity by requesting information from the function irregularity register using the serial peripheral interface. In this example, the microcontroller can discover which sensor has generated an irregularity condition. For example, if the temperature sensor associated with a given transmitter of the AEB system reports an error condition, the microcontroller may decide to program the output power level of that specific transmitter at a nominal lower level, such that its temperature will tend to decrease and come within the threshold after a period of time. In case the microcontroller, upon reading the register 3*b*, detects that the irregularity condition was generated by the PLL lock detector, then it may decide to choose another VCO sub-band to perform the frequency sweep operation, or to perform an open-loop assessment of all VCO sub-bands lower and upper frequency limits, such that the mapping of the desired frequency sweep into a given VCO sub-band can be error-free.

This arrangement is advantageous as the microcontroller does not need to select and read a plurality of different values from a plurality of different sensors. Instead, the sensors themselves can determine if a threshold has been exceeded and information from the sensors is collated at the first function element. This enables the microcontroller of the second function monitor element 4 to interrogate the first function monitor element 3 only when an irregularity is detected and flagged to it by the first function monitor element 3. Function checks that require the signal processing capabilities of the microcontroller are performed by the microcontroller while the other checks may be handled by the first function monitor element. Thus, function monitoring is distributed over several components so as not to unduly burden the microcontroller with reading and interpreting sensor measurements.

The invention claimed is:

1. A function monitor for a system, the function monitor comprising
   a dedicated device configured to receive and collate sensor data from a plurality of sensors associated with the system and send a function warning signal after the collated sensor data from one or more of the plurality of sensors is indicative of a functional irregularity; and
   a microcontroller configured to receive the function warning signal from the dedicated device, and send a power reset signal, after receiving the function warning signal, that resets the one or more of the plurality of sensors with the functional irregularity; and
   an interface wired between the dedicated device and the microcontroller configured to provide communication between the dedicated device and the microcontroller.

2. The function monitor according to claim 1, wherein the microcontroller is configured to process data for providing a service of the system.

3. The function monitor according to claim 2, wherein the function warning signal comprises an interrupt.

4. The function monitor according to claim 1, wherein the dedicated device is dedicated to monitoring for functional irregularities in the system and the microcontroller is configured to additionally process data for providing a service of the system.

5. The function monitor according to claim 1, wherein the dedicated device is configured to store identifying details of function irregularities in a memory.

6. The function monitor according to claim 1, wherein the plurality of sensors comprises at least one or more of:
   i) a temperature sensor;
   ii) a RF connection break;
   iii) an oscillator fault detector;
   iv) a clock fault sensor;
   v) a voltage level sensor.

7. The function monitor according to claim 1, wherein the dedicated device comprises a state machine.

8. The function monitor according to claim 1, wherein each sensor includes an irregularity detecting arrangement including a trigger having an irregularity detected state and a no irregularity detected state, and the trigger is configured to adopt the irregularity detected state when the irregularity detecting arrangement detects that a measurement value is outside of a predetermined threshold.

9. The function monitor according to claim 8, wherein the sensor data comprises a signal that indicates the state of the irregularity detecting arrangement.

10. The function monitor according to claim 1, wherein, in response to receiving the function warning signal, the microcontroller is configured to selectively provide a reset signal to the dedicated device and, in response to receiving the reset signal, the dedicated device is configured to reset the sensor that caused it to generate the function warning signal.

11. The function monitor according to claim 1, wherein in response to receiving the function warning signal, the microcontroller is configured to selectively provide a power down signal to the dedicated device and, in response to receiving the power down signal, the dedicated device is configured to provide instructions to power down the system.

12. The function monitor according to claim 1, wherein the interface comprises three hardware lines, the three hardware lines further comprising:
   a function irregularity reporting line configured to provide the function warning signal to the microcontroller;
   a reset sensor line configured to provide a reset signal to the dedicated device for resetting a detected function irregularity; and
   a power down line configured to provide a power down signal to the dedicated device to deactivate the system.

13. The function monitor according to claim 1, wherein the dedicated device receives a separate power supply from the microcontroller.

14. The function monitor according to claim 1, wherein the microcontroller is configured to selectively send an irregularity enquiry request to the dedicated device and, in response to said request, the dedicated device is configured to report the status of one or more of the sensors.

15. The function monitor of claim 1, wherein the system is an advanced driver assistance system.

16. The function monitor of claim 15, wherein the advanced driver assistance system is an Automatic Emergency Braking (AEB) system.

17. The function monitor of claim 1, wherein the dedicated device is configured to activate a flip flop flag after the collated sensor data is indicative of the functional irregularity.

18. The function monitor of claim 17, wherein activation of the flip flop flag causes a logic high level to be provided along a function irregularity reporting line.

19. The function monitor of claim 12, wherein the function irregularity reporting line is a one-way communication line.

20. The function monitor of claim 12, wherein the reset line comprises a force high line and a force low line.

* * * * *